United States Patent
Guidi et al.

(10) Patent No.: US 11,960,796 B2
(45) Date of Patent: Apr. 16, 2024

(54) FEATURE REPLICATION IN A CAD MODEL

(71) Applicant: BRICSYS NV, Ghent (BE)

(72) Inventors: Chloë Guidi, Dendermonde (BE); Jürgen De Zaeytijd, Merelbeke (BE); Tjerk Gauderis, Ghent (BE); Jos Van Doorsselaere, Ghent (BE)

(73) Assignee: BRICSYS NV, Ghent (BE)

( * ) Notice: Subject to any disclaimer, the term of this patent is extended or adjusted under 35 U.S.C. 154(b) by 496 days.

(21) Appl. No.: 17/017,827

(22) Filed: Sep. 11, 2020

(65) Prior Publication Data

US 2021/0073431 A1    Mar. 11, 2021

(30) Foreign Application Priority Data

Sep. 11, 2019  (EP) .................................... 19196814

(51) Int. Cl.
  *G06F 30/12*  (2020.01)
  *G06T 19/20*  (2011.01)

(52) U.S. Cl.
  CPC .............. *G06F 30/12* (2020.01); *G06T 19/20* (2013.01); *G06T 2219/2016* (2013.01)

(58) Field of Classification Search
  CPC .......... G06F 30/12; G06F 30/13; G06F 30/00; G06F 30/17; G06F 30/18; G06T 19/20; G06T 2219/2016
  USPC ........................................................ 703/10
  See application file for complete search history.

(56) References Cited

U.S. PATENT DOCUMENTS

| | | | |
|---|---|---|---|
| 5,838,328 A * | 11/1998 | Roller | G06F 30/17 715/255 |
| 7,079,990 B2 | 7/2006 | Haller et al. | |
| 2007/0174027 A1* | 7/2007 | Moiseyev | G06F 30/13 703/1 |
| 2014/0107988 A1* | 4/2014 | Morton | G06F 17/00 703/2 |

(Continued)

FOREIGN PATENT DOCUMENTS

WO    2017098469 A1    6/2017

OTHER PUBLICATIONS

Vermeer_1994 (Medial Axis Transform to Boundary Representation Conversion, Purdue University, 1994). (Year: 1994).*

(Continued)

*Primary Examiner* — Brian S Cook
(74) *Attorney, Agent, or Firm* — Maschoff Brennan

(57) ABSTRACT

A region of a CAD model is obtained via user drawing of a boundary for the region in a GUI. The boundary entirely encloses one or more entities and intersects one or more entities. For each intersecting entity, a reference point on the intersecting entity and a reference direction at the reference point are determined. Based on the reference points and reference directions, a candidate set of candidate entities which are spatially compatible with the intersecting entities is searched. A spatial transformation which maps each reference point and reference direction onto a candidate entity of the candidate set is computed. The one or more entirely enclosed entities are replicated according to the spatial transformation, or replication is suggested via a visualization means. In an embodiment, the CAD model is two-dimensional, the intersecting entities are curves, and the reference direction of an intersecting curve is tangent to the intersecting curve.

18 Claims, 5 Drawing Sheets

(56) References Cited

U.S. PATENT DOCUMENTS

2017/0169135 A1 6/2017 Kumar et al.
2018/0103209 A1* 4/2018 Fischler ................. H04N 23/64

OTHER PUBLICATIONS

Archicad_2013 (Selecting Elements—ArchiCAD Video Series, Jan. 22, 2013 Downloaded from Youtube.com/watch?v=zcg Du_wGQNA) (Year: 2013).*
EESR in EP application 19196814.8 dated Mar. 19, 2020.

* cited by examiner

FIG. 1A
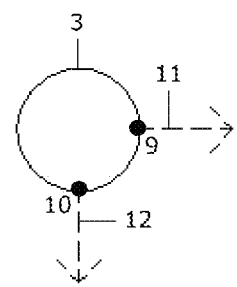
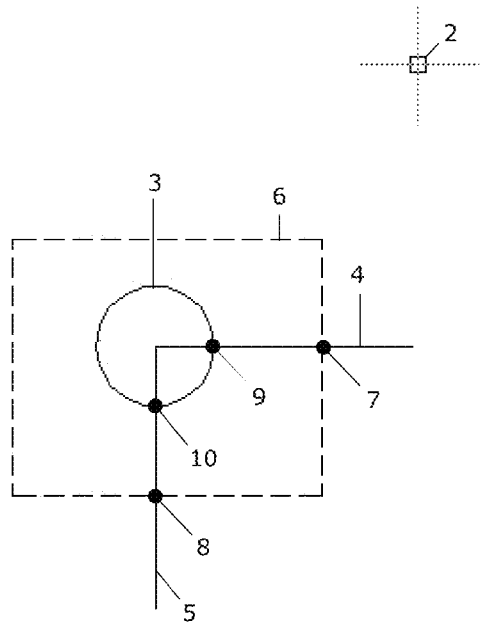
FIG. 1B
FIG. 1C
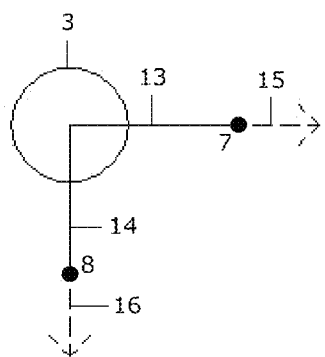

FEATURE REPLICATION IN A CAD MODEL

FIELD OF THE INVENTION

The invention pertains to feature replication, or the suggestion via a visualization means of feature replication, in a computer-aided design (CAD) model.

BACKGROUND

U.S. Pat. No. 7,079,990 B2 discloses a method for use within a 3D CAD model. A corresponding part (e.g. a fastener) is automatically identified for a feature (e.g. a hole) based on attributes of the feature. The geometry of the identified part may be adjusted based on attributes of the feature (e.g. fastener length to match hole depth). The identified part is then automatically positioned in a coupling relationship with the feature.

U.S. Pat. No. 7,079,990 B2 does not provide for feature replication of a feature of the CAD model. U.S. Pat. No. 7,079,990 B2 does not provide for feature replication to a surrounding similar to the current surrounding of the feature. U.S. Pat. No. 7,079,990 B2 is concerned with selecting for a feature a part from an external part library, solely based on attributes of the feature.

The present invention aims to provide for feature replication in a CAD model to a surrounding similar to the current surrounding of the feature.

US 2017/0 169 135 A1 discloses a replication method for use within CAD software. The method, according to the abstract, ignores parametric requirements and instead searches 3D geometry of components mated to a replication candidate that are identical to those on which the replication candidate is constrained.

US 2017/0 169 135 A1 does not provide for detecting and/or adapting a non-identical but related component for mating a replication candidate. US 2017/0 169 135 A1 does not provide for efficiently detecting related components in a CAD model in case multiple components are mated with a single replication candidate.

The present invention aims to resolve at least some of the problems and disadvantages mentioned above.

SUMMARY OF THE INVENTION

In a first aspect, the present invention provides a computer-implemented method (CIM) for feature replication in a CAD model, according to claim 1.

In a second aspect, the present invention provides a computer system for feature replication in a CAD model. The computer system is configured for performing the CIM according to the first aspect.

In a third aspect, the present invention provides a computer program product (CPP) for feature replication in a CAD model. The CPP comprises instructions which, when the CPP is executed by a computer, cause the computer to carry out the CIM according to the first aspect.

The present invention provides for replication of the one or more entirely enclosed entities to a surrounding similar to the current surrounding of the one or more entirely enclosed entities. The surrounding is determined based on the intersecting entities, and in particular based on the reference points and reference directions. Based on a limited set of attributes, i.e. the reference points and reference directions, candidate sets of candidate entities may efficiently be retrieved.

In an embodiment, the region encompasses the reference points, and each reference point defines an inner and an outer part of the corresponding intersecting entity. An outer part is thereby positioned at least partially outside of the region. The spatial transformation maps reference points onto candidate points of the candidate entities of the candidate set. Each candidate point defines an inner and an outer part of the corresponding candidate entity. In addition to replication of the entirely enclosed entities, replacement of the inner parts of the candidate entities with the inner parts of the intersecting entities according to the spatial transformation is performed or suggested via a visualization means. Suitable, but non-identical candidate entities may be found, and subsequently modified to "accommodate" the replication.

Further embodiments and advantages are discussed in the detailed description of the invention, below.

DESCRIPTION OF FIGURES

FIGS. 1A, 1B and 1C show schematic representations comprising examples to illustrate region selection, and reference point and reference direction determination.

DETAILED DESCRIPTION OF THE INVENTION

Figure 2A:
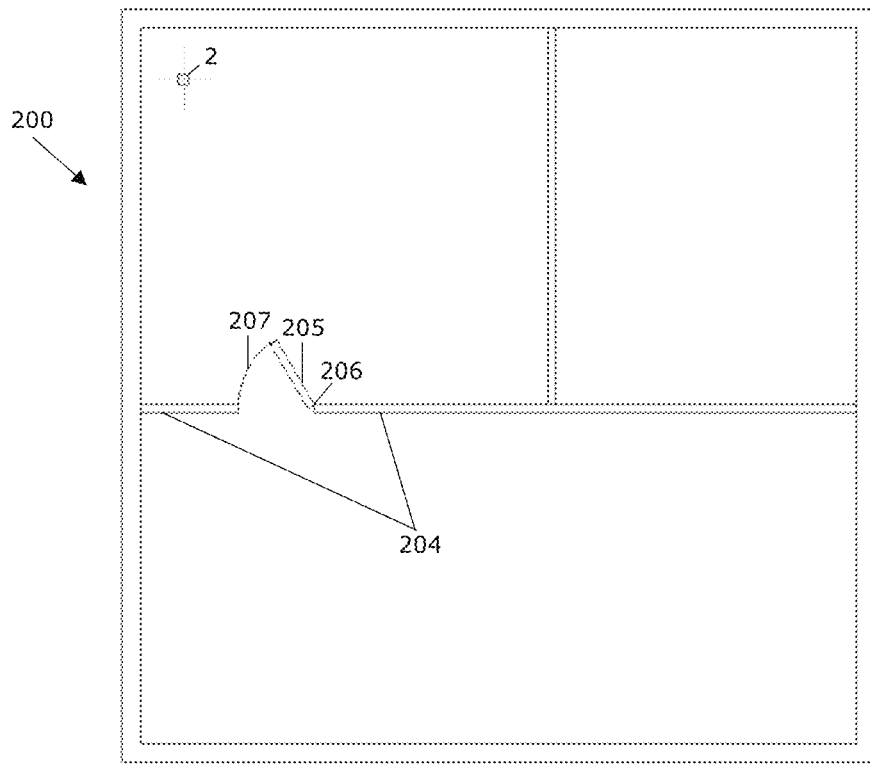
FIGS. 2A, 2B, 2C and 2D show schematic representations of an exemplary CAD model (200) at various stages during editing of the CAD model via an embodiment according to the present invention.
Figure 2B:
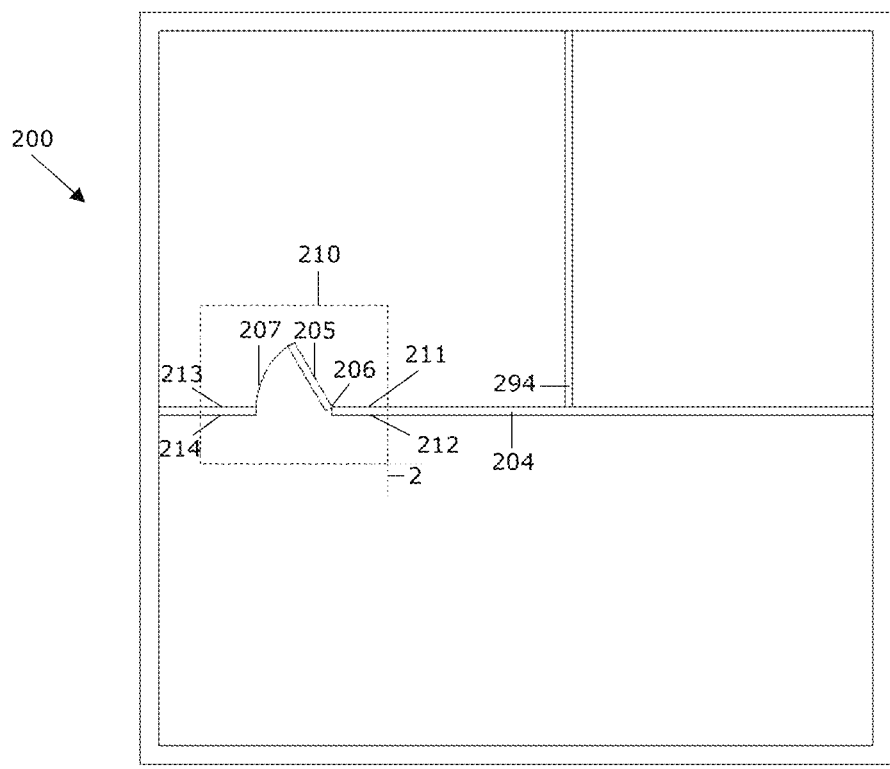

The present invention concerns a CIM, a computer system, and a CPP for feature replication in a CAD model. The invention has been summarized in the corresponding section above. In what follows, the invention will be described in detail, preferred embodiments are discussed, and the invention will be illustrated by means of non-limitative examples.

Unless otherwise defined, all terms used in disclosing the invention, including technical and scientific terms, have the meaning as commonly understood by one of ordinary skill in the art to which this invention belongs. By means of further guidance, term definitions are included to better appreciate the teaching of the present invention.

Term Definitions

"A", "an", and "the" as used herein refer to both singular and plural referents unless the context clearly dictates otherwise. By way of example, "a compartment" refers to one or more than one compartment.

"Comprise", "comprising", "comprises" and "comprised of" as used herein are synonymous with "include", "including", "includes" or "contain", "containing", "contains" and are inclusive or open-ended terms that specify the presence of what follows (e.g. component) and do not exclude or preclude the presence of additional, non-recited components, features, elements, members, and steps.

"Based on" as used herein is synonymous with "based at least in part on" and is an inclusive or open-ended term that specifies the presence of what follows (e.g. component) and does not exclude or preclude the presence of additional, non-recited components, features, elements, members, and steps.

A "computer-aided design model" (CAD model), as used herein, comprises computer-processable data, preferably digital data, about one or more entities. The data represents, or allows to derive, one or more properties of an entity, such as geometric properties, material properties and/or semantic properties. In case the CAD model comprises computer-processable data about multiple entities, the data also represents, or allows to derive, relative geometric properties between entities. The present invention may pertain to various types of CAD models, such as, for example, a building information model (BIM), a computer-aided architectural design (CAAD) model, or a mechanical engineering CAD model. An exemplary file format for storing a CAD model is DWG. One of ordinary skill in the art will appreciate that a CAD model comprises a computer-processable image in vector format, e.g. in DWG file format, defined in terms of low-level features, such as, for example, vertices, edges, and faces.

A CAD model may be viewed and edited via a corresponding CPP, so-called CAD software. CAD software preferably provides a graphical user interface (GUI) for viewing and editing the CAD model. A non-limiting list of examples of CAD software comprises 123D, ACIS, Advance Concrete, Advance Design, Advance Steel, AllyCAD, ArchiCAD, AutoCAD, BricsCAD, BRL-CAD, C3D, Caddie, Cadwork, CATIA, Chief Architect, Cobalt, Creo, DataCAD, DesignSpark Mechanical, Digital Project, Drawing Express, FINE MEP, form•Z, FreeCAD, HiCAD, IDEA Architectural, Inventor, IRONCAD, ItelliCAD, KeyCreator, LibreCAD, MEDUSA, MicroStation, Modelur, NanoCAD, NX, OpenCASCADE, OpenSCAD, Parasolid, PTC Creo, PowerCADD, progeCAD, PunchCAD, QCad, Revit Architecture, Revit MEP, Revit Structure, Rhinoceros 3D, RoutCad, SALOME, ShapeManager, SketchUp, Solid Edge, SolidWorks, SolveSpace, SpaceClaim, SpaceClaim Engineer, Tekla Structures, TopSolid, TransMagic, TurboCAD, VariCAD, VectorWorks, and VisualARQ.

Aspects of the Present Invention

In a first aspect, the present invention provides a CIM for feature replication in a CAD model, comprising several steps. In a second aspect, the present invention provides a computer system for feature replication in a CAD model. The computer system is configured for performing the CIM according to the first aspect. In a third aspect, the present invention provides a CPP for feature replication in a CAD model. The CPP comprises instructions which, when the CPP is executed by a computer, such as a computer system according to the second aspect, cause the computer to carry out the CIM according to the first aspect. The present invention also provides a tangible non-transitory computer-readable data carrier comprising said CPP. The three aspects of the present invention are hence interrelated. Therefore, all features disclosed in this document, above or below, may relate to each of these aspects, even if they have been disclosed in conjunction with a particular aspect.

A reference CAD model comprises multiple entities. A region of the reference CAD model is obtained via user drawing of a boundary for the region in a GUI. The boundary entirely encloses one or more entities of the reference CAD model, hereafter referred to as "entirely enclosed entities" or "enclosed entities". The boundary intersects one or more entities of the reference CAD model, hereafter referred to as "intersecting entities". For each intersecting entity, a reference point on the intersecting entity and a reference direction at the reference point are automatically determined. In a target CAD model, based on the reference points and reference directions, a candidate set of candidate entities which are spatially compatible with the intersecting entities is automatically searched for. A spatial transformation which maps each reference point and reference direction onto a candidate entity of the candidate set is automatically computed. Replication of the one or more entirely enclosed entities according to the determined spatial transformation is performed, or suggested via a visualization means.

The number of intersecting entities may or may not be equal to the number of candidate entities. An intersecting entity may intersect the boundary once, or multiple times at disjoint portions of the boundary. In the latter case, per intersection with the boundary, a reference point and corresponding reference direction are determined. The spatial transformation may map one reference point and the associated reference direction, or multiple reference points and the associated reference directions, onto a single candidate entity.

The target CAD model may be or may not be the reference CAD model. Preferably, the reference and target CAD models are two-dimensional, i.e. they comprise two spatial dimensions.

A user may, for example, create the reference CAD model via the GUI. A user may, for example, provide a pointer to a reference file stored on a tangible non-transitory computer-readable storage medium, wherein the reference file comprises the reference CAD model. A user may, for example, edit the reference CAD model via the GUI.

A user may, for example, create the target CAD model via the GUI. A user may, for example, provide a pointer to a target file stored on a tangible non-transitory computer-readable storage medium, wherein the target file comprises the target CAD model. A user may, for example, edit the target CAD model via the GUI.

In case of suggestion of replication, a user may, for example, accept a suggested replication via the GUI, e.g. via a computer mouse button click. The GUI may in particular pertain to said visualization means and a user input device, e.g. said computer mouse. The suggestion of replication may thereby "follow" a cursor in the GUI, as detailed below.

After replication, the modified target CAD model may be stored automatically or via user input on a tangible non-transitory computer-readable storage medium. A user may, for example, press a save button via the GUI, whereupon the target file is (at least in part) overwritten on said tangible non-transitory computer-readable storage medium. A user may, for example, press a save button via the GUI, select a folder via the GUI, and enter a filename via a keyboard, for storage of the target CAD model in said folder under said filename.

The present invention provides for replication of said one or more entirely enclosed entities to a surrounding similar to the current surrounding of said one or more entirely enclosed entities. The surrounding is determined based on the intersecting entities, and in particular based on the reference points and reference directions. Based on a limited set of attributes, i.e. the reference points and reference directions, candidate sets of candidate entities may efficiently be retrieved.

In a preferred embodiment, the region encompasses the reference points. As used herein, the "region" comprises the boundary. The region "encompassing" the reference points hence also includes the possibility of a reference point being positioned on the boundary.

In a preferred embodiment, a reference point on an intersecting entity defines an inner and an outer part of the intersecting entity. The outer part is positioned at least partially outside of the region. The spatial transformation maps the reference point onto a candidate point of a candidate entity of the candidate set. The candidate point on the candidate entity defines an inner and an outer part of the candidate entity. In addition to replication of the entirely enclosed entities, replacement of the inner parts of the candidate entities with the inner parts of the intersecting entities according to the spatial transformation is performed, or suggested via the visualization means. The step of replicating, or suggesting via a visualization means the replication of, the one or more entirely enclosed entities according to the determined spatial transformation comprises in this case replacing, or suggesting via a visualization means the replacement of, the inner parts of the candidate entities with the inner parts of the intersecting entities according to the determined spatial transformation. Replacement of the inner parts of the candidate entities with the inner parts of the intersecting entities thereby achieves a modification of the candidate entities to accommodate for the replication of the entirely enclosed entities. Suitable, but non-identical candidate entities may be found, and may subsequently be modified to "accommodate" the replication.

In a preferred embodiment, the region is a polygonal or polyhedral region. Preferably, the region is a rectangular or cuboidal region. Preferably, the rectangular or cuboidal region is obtained via user dragging of a cursor in the GUI from a first point to a second point. A boundary for the rectangular or cuboidal region may thereby be defined, wherein the boundary comprises the first point and the second point at diagonally opposing corners. Preferably, the CAD model comprises a global coordinate system (GCS), whereby the rectangular or cuboidal region is aligned with the GCS. Preferably, a cursor in the GUI is positioned at a first point via user input (e.g. computer mouse translation). A user selection input (e.g. mouse button click) is then received, confirming the first point and during the receiving of which (i.e. while receiving the user selection input, e.g. while keeping the computer mouse button pressed) the cursor in the GUI is moved via user input (e.g. computer mouse translation) from the first point to a second point, upon which the user selection input is removed (e.g. releasing the computer mouse button), confirming the second point. Depending on whether the CAD model is two-dimensional or three-dimensional, respectively a rectangular boundary or a cuboidal boundary, is thereby defined. Preferably, the reference CAD model is two-dimensional and the region is a rectangular region.

In a preferred embodiment, a reference point is positioned on an intersecting entity at a position with a minimal distance to an enclosed entity. Preferably, a reference point is positioned on an enclosed entity. In case an enclosed entity has a volume, the reference point is preferably positioned on the surface of the enclosed entity. In case it is not possible to position the reference point on an enclosed entity, the reference point is positioned on the intersecting entity at a position with a minimal distance to an enclosed entity. A person skilled in the art will appreciate that positioning a reference point at a position with a minimal distance to an enclosed entity encompasses the case of positioning a reference point on an enclosed entity in case said minimal distance is equal to zero.

In another preferred embodiment, the reference point is positioned on the boundary of the region.

In a preferred embodiment, the spatial transformation comprises a translation, a rotation, optionally a scaling, optionally an inversion, optionally a reflection, and optionally a skewing.

In a preferred embodiment, the boundary comprises at least two, preferably at least three, intersections with the intersecting entities, and for each intersection a reference point and a reference direction at the reference point.

In a preferred embodiment, an intersecting entity is a curve and a candidate entity is a curve. A non-limiting list of examples of curves comprises a line, a circle, an arc, a spline, and the like. The reference direction at the reference point is preferably tangent to the associated intersecting curve. The spatial transformation maps each reference point onto a candidate point of a candidate curve of the candidate set and the reference direction associated with the reference point tangent to the candidate curve at the candidate point.

In a preferred embodiment, the boundary comprises at least two intersections with the intersecting entities, a first reference direction corresponds to a first reference point, and a second reference direction corresponds to a second reference point. In this preferred embodiment, the candidate set and spatial transformation are obtained as follows. An offset distance is automatically determined between the first and second reference points. An offset angle of a vector, from the first reference point to the second reference point, with respect to the first reference direction is automatically determined. A first candidate curve of the target CAD model is automatically obtained. An offset curve of offset points is automatically determined. Each offset point is associated with a candidate point of the first candidate curve. The offset point and the candidate point comprise said offset distance. A vector, from the candidate point to the offset point, comprises said offset angle with respect to a tangent direction to the first candidate curve at the candidate point. A second curve of the target CAD model which intersects with the offset curve is automatically determined. The second curve may be the first candidate curve or may be another curve of the target CAD model. A trial spatial transformation which maps the first reference point onto the first candidate curve, the first reference direction tangent to the first candidate curve, and the second reference point onto the second curve is automatically computed. It is automatically verified whether the trial spatial transformation maps the second reference direction tangent to the second curve. In case of tangency, the second curve is preferably accepted as a second candidate curve. In case of third and further reference points and reference directions, further filtering, in a manner similar as described above, is preferably performed.

In a preferred embodiment, an initial list of curves of the target CAD model is automatically obtained. A second list of candidate sets (each comprising at most two candidate curves) compatible with the first and second reference points and directions is filtered from the initial list, as disclosed above. If relevant, a third list of candidate sets (each comprising at most three candidate curves) compatible with the first, second and third reference points and directions is filtered from the second list, in a manner similar as described above. A recursive filtering, starting from an initial list of candidate sets each comprising one curve of the target CAD model, of an N-th list of candidate sets from an (N-1)-th list of candidate sets, is hence performed until N is equal to the number of intersections of the intersecting curves with the boundary.

In a preferred embodiment, for the first candidate curve four at least partially non-overlapping offset curves are determined. The tangent direction of the first candidate curve is not uniquely defined. At a point of the first candidate curve, two opposite tangent directions may be obtained. Furthermore, in order to accommodate mirroring, both said offset angle and minus said offset angle, with each of said two opposite tangent directions have to be considered. This gives rise to four offset curves for the first candidate curve.

In a preferred embodiment, a list of multiple candidate sets of candidate entities which are spatially compatible with the intersecting entities is automatically retrieved. A candidate set is selected from the list based on proximity to said region or proximity to a cursor of the GUI. The spatial transformation is computed for the selected candidate set. The replication, or suggestion of replication, is performed for the selected candidate set.

In a preferred embodiment, the region encompasses the boundary points and the reference directions are tangent to the associated intersecting curve and point from the reference point outward with respect to the boundary.

One of ordinary skill in the art will appreciate that a candidate set of candidate entities may be associated with multiple suitable spatial transformations which each map each reference point and reference direction onto a candidate entity of the candidate set. The suitable spatial transformations may even comprise a continuum of spatial transformations. In particular, if a spatial transformation maps each reference point and reference direction onto a portion of a candidate entity of the candidate set which remains parallel to the mapped reference direction, these portions may define a continuum of spatial transformations. The suggestion of replication is then preferably performed for a spatial transformation which maps the one or more entirely enclosed entities most proximate to a cursor of the GUI. Upon movement of the cursor in the GUI, the suggested mapping may track the cursor movement. A related embodiment is disclosed in example 2 below.

The invention is further described by the following non-limiting examples which further illustrate the invention, and are not intended to, nor should they be interpreted to, limit the scope of the invention.

EXAMPLES

Example 1: Embodiment of the Present Invention

The creation of technical 2D plans involves the placement of many individual lines. Typically, many of these lines form semantic groups that are repeated throughout the design and embedded in the larger context. For instance, in a 2D floorplan windows and doors (semantic group) are repeated and embedded in the lines representing the walls (context). In mechanical CAD, many grooves, holes and other features are indicated on the main lines.

The present embodiment provides a method for:
selecting a 2D feature,
determining the context of the 2D feature,
determining similar contexts in the drawing, and
copying and embedding the feature at intended locations.

First a magnetic feature is determined, and subsequently the magnetic feature is embedded at auto-determined possible locations.

There are two types of magnetic 2D features: entity magnetic features and region magnetic features. Both are selected in the same way, by drawing a selection polygon, e.g. via user dragging of a selection rectangle.

FIG. 1A shows a schematic representation comprising an example to illustrate region selection. A user draws a rectangular boundary (6) for the region in a GUI, preferably via user dragging of a cursor (2) from a first point to a second point to define the rectangular boundary. The boundary (6) entirely encloses an entity (3), and intersects two entities (4, 5). Points 7 and 8 are the intersection points of intersecting entities 4 and 5, respectively, with the boundary. Points 9 and 10 are the points on the intersecting entities 4 and 5, respectively, which comprise a minimal distance with the entirely enclosed entity (3).

FIG. 1B shows an entity magnetic feature corresponding with the embodiment shown in FIG. 1A. The entities (3) which are entirely enclosed in the region (6) are the entities encapsulated in the feature. All entities intersecting the border of the region are used for adding magnetic vectors to the feature. A magnetic vector comprises a reference point and a reference direction, at the reference point and tangent to the associated intersecting curve. A magnetic vector is used to map a feature to a target curve, by placing the feature with the reference point of the magnetic vector on the target curve and rotating and/or mirroring in such a way that the reference direction is tangent to the target curve. A reference point for an intersecting entity is determined as an intersection point of the intersecting entity with the feature entities (the ones entirely enclosed in the region), or in case this is missing, the point that is closest to the feature entities. At the reference point, the reference direction is determined as the outwards pointing tangent to the intersecting curve. For intersecting entities 4 and 5, the reference points are 9 and 10, respectively, and the reference directions 11 and 12, respectively.

FIG. 1C shows a region magnetic feature corresponding with the embodiment shown in FIG. 1A. In this embodiment, a reference point for an intersecting entity is determined as an intersection point of the intersecting entity with the boundary. At the reference point, the reference direction is determined as the outwards pointing tangent to the intersecting curve. For intersecting entities 4 and 5, the reference points are 7 and 8, respectively, and the reference directions 15 and 16, respectively. A reference point of an intersecting defines an inner part and an outer part of the intersecting entity. Reference point 7 defines inner part 13 of intersecting entity 4, for example. Reference point 8 defines inner part 14 of intersecting entity 5, for example. The feature comprises the entirely enclosed entities (3), as well as the inner parts (13, 14) of the intersecting entities. A region magnetic feature hence "encapsulates all graphics inside the region". This includes all intersecting curves "trimmed" to their parts inside the region.

Possible replication locations are automatically determined depending on the magnetic vectors. Via the GUI, the most suitable location near the cursor position is suggested. Clicking a computer mouse button inserts the feature.

Thereto, first all curves in the relevant region are identified.

A first magnetic vector of the feature is selected. The initial set of possible locations are just the identified curves, where the feature can be placed by translating, rotating and/or mirroring so that the reference point of the first magnetic vector lies on the curve and the reference direction of the first magnetic vector is tangent to the curve.

A second magnetic vector of the feature is selected. An offset vector between the reference points of the first magnetic vector and the second magnetic vector is determined. The offset vector comprises an angle with the reference direction of the first magnetic vector. For each identified curve, four offset curves are created by offsetting the identified curve with the offset vector under said angle with respect to a tangent of the identified curve. The intersections (both curve segments and individual intersection points) between the offset curves and the identified curves are determined, and then further filtered based on tangency of the mapped reference direction of the second magnetic vector.

Third and further magnetic vectors are treated similarly as the second one, and further filtering based on corresponding offset curves is performed.

The configuration that will be shown to the user is the one for which the center of the feature (center of the region, geometric center of the entirely enclosed entities, or the like) is closest to the current cursor position. In the GUI, the closest (or most suitable) place is shown for the current cursor position. A simple click initiates the insertion of the feature at that location. This involves a rotation of the feature so that the magnetic vectors are aligned with the curves at the location. The curves at the location can also be trimmed and/or (in part) replaced correspondingly to accommodate the feature.

Example 2: Embodiment of the Present Invention

The present example pertains to FIGS. 2A, 2B, 2C and 2D, which show schematic representations of an exemplary CAD model (200) at various stages during editing of the CAD model via an embodiment according to the present invention. The present example also pertains to example 1.

The CAD model comprises a wall (204) comprising a door (205, 206, 207). The door comprises an opening arc (207), a door panel (205) and a wall end line (206). The door is represented via one or more curves.

With a cursor (2), a user may draw (FIG. 2B) a rectangular boundary (210) for selecting a region. The curves pertaining to the door are entirely enclosed in the region. The boundary intersects the wall (204) at four line segments (211, 212, 213, 214) of the wall (204). Based on the four intersecting line segments, four reference points and corresponding outward pointing tangent reference directions are determined. In this particular example, the reference points are chosen on the entirely enclosed entities (entity magnetic feature).

Figure 2C:
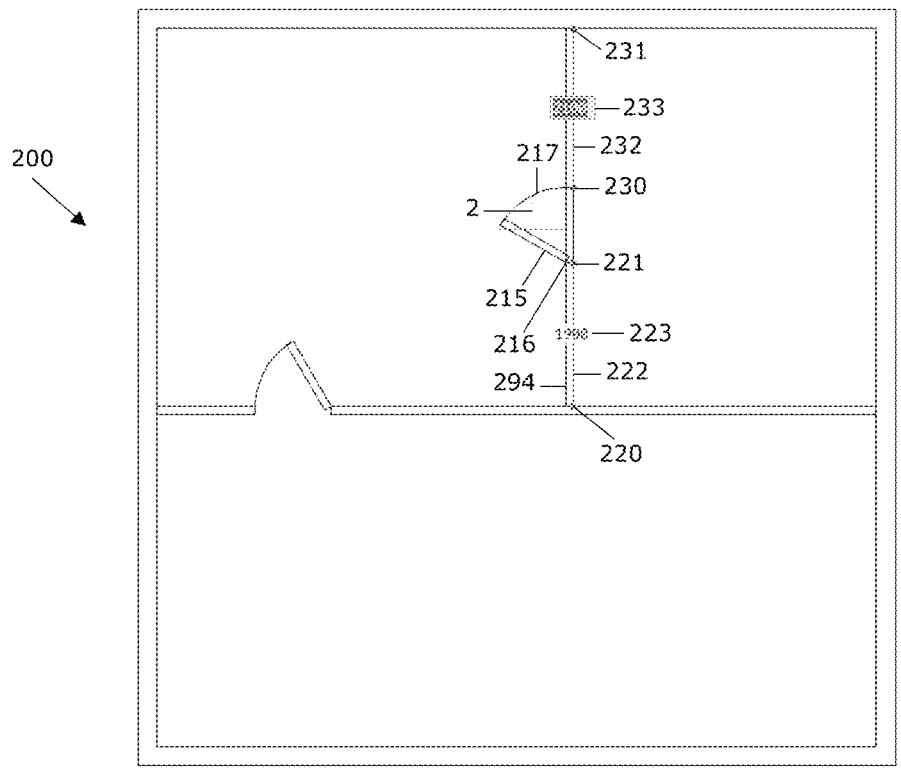

After selection of the region, the user moves the cursor (2) to another wall (294) with equal thickness. This wall is represented in the CAD model by two line segments. The four reference points and corresponding reference directions can be mapped onto the two line segments of the other wall (294) near the cursor (2) position. In fact, with the two line segments, a continuum of possible mappings is associated, as the line segments remain parallel to the mapped reference directions along their entire length. Feature replication is suggested via the GUI, in particular a replication of the entities pertaining to the door (opening arc (217), door panel (215), wall end line (216)), in mirrored form, as shown in FIG. 2C. Upon movement of the cursor along this other wall (294), the suggested replication follows cursor movement.

Figure 2D:
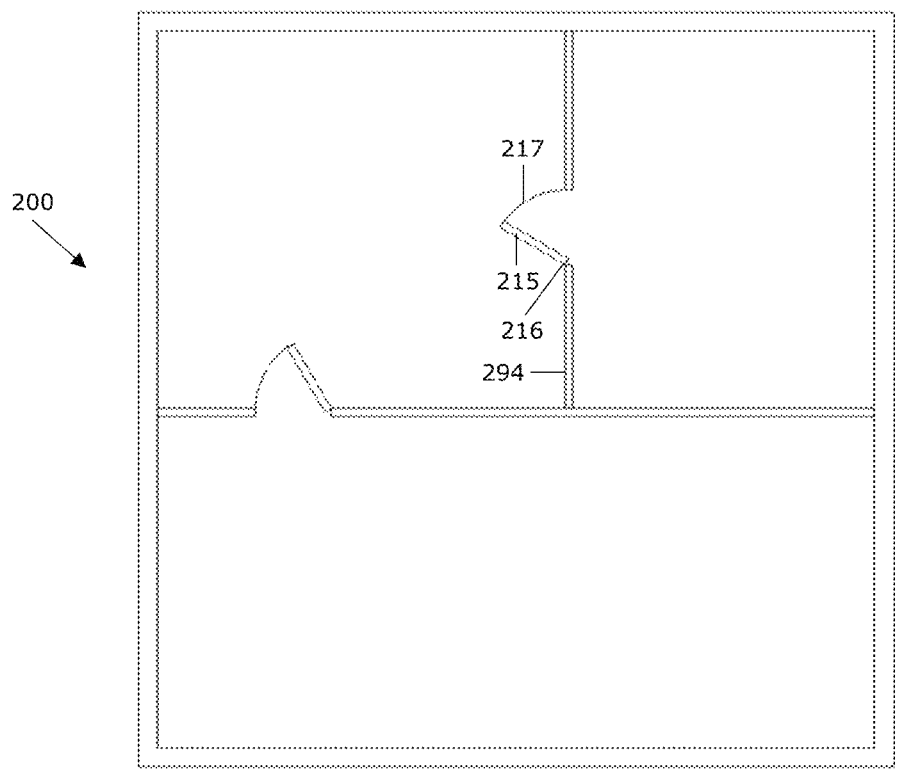

Additionally, a first distance indicator (230, 231, 232, 233) from a first reference point (at 230) to an outer end of a line segment of the wall is shown. The distance indicator thereby follows the reference direction associated with the first reference point. The distance indicator comprises two points (230, 231), an indicator line (232) and a textbox (233) comprising a distance value, which is, as shown in FIG. 2C, active for overwriting the distance value. A second distance indicator (220, 221, 222, 223) from a second reference point (at 221) to an outer end of a line segment of the wall is also shown. The distance indicator thereby follows the reference direction associated with the second reference point. The distance indicator comprises two points (220, 221), an indicator line (222) and a distance value (223). Via a TAB key on the keyboard, the user can toggle (switch between) activation of the distance values. Upon overwriting a distance value (e.g. entering a numerical value via a keyboard and pressing ENTER) or moving the cursor (e.g. via a computer mouse) and confirming the position (e.g. via clicking a computer mouse button), the entirely enclosed entities of the door are inserted correspondingly (FIG. 2D).

With the mapping of the door entities 'onto' the wall (294), the reference points are mapped onto candidate points on the line segments of the wall (294). The candidate points define outer parts (line segment 230 to 231, and line segment 221 to 220) and an inner part (line segment 221 to 230) of each line segment of the wall (294). Insertion of the door trims the inner parts of the line segments of the wall (294). As the intersecting curves of the original wall (204) do not comprise inner parts, the trimmed portions of wall (294) are not replaced.

Example 3: Embodiment of the Present Invention

The present example pertains to FIGS. 3A, 3B, 3C, 3D, 3E and 3F, which show schematic representations of an exemplary CAD model (300) at various stages during editing of the CAD model via an embodiment according to the present invention. The present example also pertains to example 1.

The CAD model comprises a first line segment (301), a second line segment (302), a third line segment (303), a fourth line segment (304), and a circle (305).

With a cursor (2), a user may draw (FIG. 3B) a rectangular boundary (306) for selecting a region. The circle (305) is entirely enclosed in the region. The first and second line segments (301, 302) intersect the boundary at points (307) and (308). Based on the intersecting line segments, two reference points (309, 310) and corresponding outward pointing tangent reference directions are determined. In this particular example, the reference points are chosen on the entirely enclosed entities (entity magnetic feature).

Figure 3A:
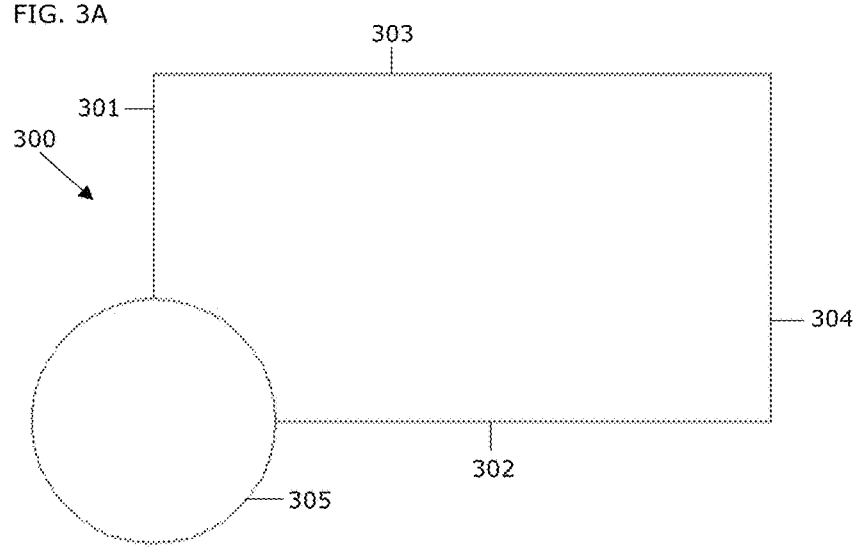
FIGS. 3A, 3B, 3C, 3D, 3E and 3F show schematic representations of an exemplary CAD model (300) at various stages during editing of the CAD model via an embodiment according to the present invention.
Figure 3B:
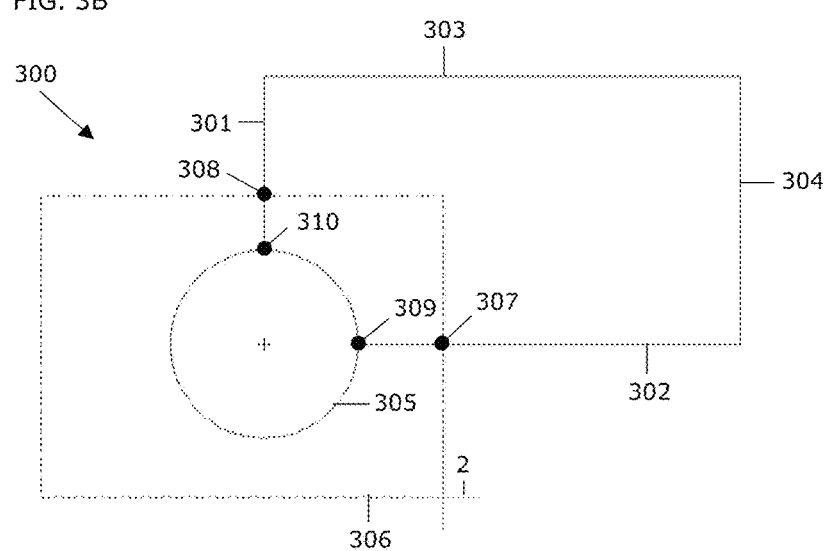
Figure 3C:
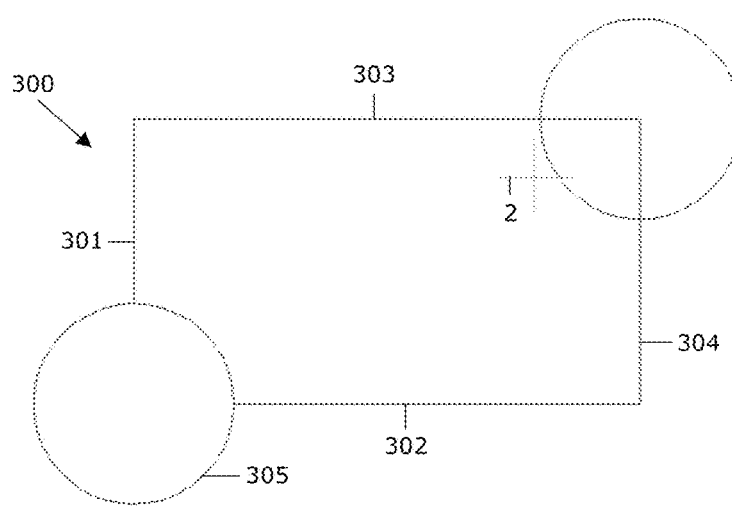

After selection of the region, the user moves the cursor (2) to the junction of the third and fourth line segments (303, 304). The two reference points and reference directions can be mapped onto these line segments near the cursor (2) position. Feature replication is suggested via the GUI, in particular of the circle, as shown in FIG. 3C.

Figure 3D:
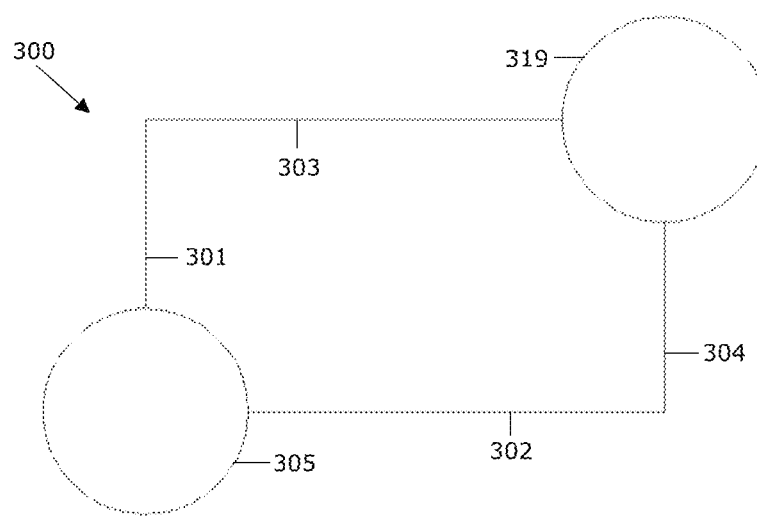

Upon confirming the suggestion (e.g. via clicking a computer mouse button), the suggested circle (319) is inserted. With the mapping of the circle, the reference points are mapped onto candidate points on the third and fourth line segments. The candidate points define an outer part and an inner part of these line segments. Insertion of the door trims the inner parts of the third and fourth line segments (FIG. 3D).

Figure 3E:
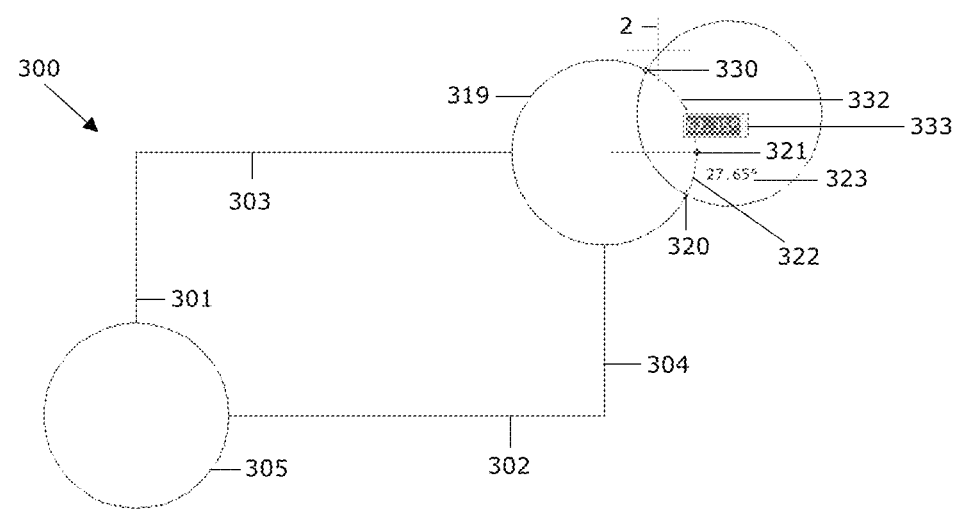

A further replication of the feature may be suggested, as shown in FIG. 3E. This may occur automatically upon confirming the previous suggestion, after reinstating via user input of the previous region selection, or after selecting a new region comprising one of the two circles (305, 319). The two reference points and reference directions can be mapped onto the second circle (319) near the cursor (2) position. The reference directions are thereby tangent to the second circle (319) at corresponding candidate points (330, 320) onto which the reference points are mapped.

Figure 3F:
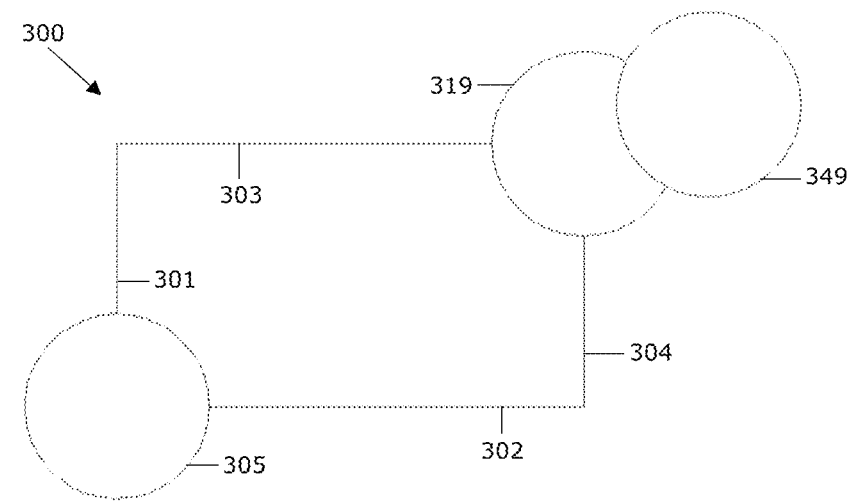

Additionally, a first angle indicator (322, 323) from a horizontal reference line (321) to a first candidate point (320) is shown. The first angle indicator comprises an arc (322) and an angle value (323). A second angle indicator (332, 333) from the horizontal reference line (321) to a second candidate point (330) is also shown. The second angle indicator comprises an arc (332) and a textbox (333) comprising an angle value, which is, as shown in FIG. 3E, active for overwriting the angle value. Via a TAB key on the keyboard, the user can toggle (switch between) activation of the angle values. Upon overwriting an angle value (e.g. entering a numerical value via a keyboard and pressing ENTER) or moving the cursor (e.g. via a computer mouse) and confirming the position (e.g. via clicking a computer mouse button), the suggested circle (349) is inserted correspondingly (FIG. 3F).

With the mapping of the circle, the reference points are mapped onto candidate points (320, 330) of the second circle (319). The candidate points define an outer part (from 330 to 320: the part with the indication line for number 319) and an inner part (from 330 to 320: the part with the indication lines for the arcs (322, 332) of the angle indicators). Insertion of the suggested circle (349) trims the inner part of the second circle (319) (FIG. 3F).

The invention claimed is:

1. Computer-implemented method for feature replication in a computer-aided design model, comprising the steps of:
   obtaining a region of a reference computer-aided design model, via user drawing of a boundary for the region in a graphical user interface, wherein the boundary:
      entirely encloses one or more entities of the reference computer-aided design model; and
      intersects one or more entities of the reference computer-aided design model;
   automatically determining for each intersecting entity a reference point on the intersecting entity and a reference direction at the reference point, and wherein the region encompasses the reference points;
   automatically searching, based on the reference points and reference directions, in a target computer-aided design model, for a candidate set of candidate entities which are spatially compatible with the intersecting entities, wherein a reference point on an intersecting entity defines an inner and an outer part of the intersecting entity, wherein the outer part is positioned at least partially outside said region;
   automatically computing a spatial transformation which maps each reference point and reference direction onto a candidate entity of the candidate set, wherein the spatial transformation maps the reference point onto a candidate point of a candidate entity of the candidate set, wherein the candidate point on the candidate entity defines an inner and an outer part of the candidate entity;
   replicating, or suggesting via a visualization means the replication of, the one or more entirely enclosed entities according to the determined spatial transformation, wherein said step of replicating, or suggesting via a visualization means the replication of, the one or more entirely enclosed entities according to the determined spatial transformation comprises replacing, or suggesting via a visualization means the replacement of, the inner parts of the candidate entities with the inner parts of the intersecting entities according to the determined spatial transformation.

2. Computer-implemented method according to claim 1, wherein the reference and target computer-aided design models are two-dimensional.

3. Computer-implemented method according to claim 1, wherein the region is a polygonal or polyhedral region.

4. Computer-implemented method according to claim 1, wherein the region is a rectangular or cuboidal region.

5. Computer-implemented method according to claim 4, wherein the rectangular or cuboidal region is obtained via user dragging of a cursor in the graphical user interface from a first point to a second point, thereby defining a boundary for the rectangular or cuboidal region, wherein the boundary comprises said first point and said second point at diagonally opposing corners.

6. Computer-implemented method according to claim 1, wherein the region comprises the boundary, wherein the region encompasses the reference points.

7. Computer-implemented method according to claim 6, wherein a reference point is positioned on an intersecting entity at a position with a minimal distance to an enclosed entity.

8. Computer-implemented method according to claim 6, wherein the reference points are positioned on the boundary of the region.

9. Computer-implemented method according to claim 1, wherein an intersecting entity is a curve, wherein a candidate entity is a curve, wherein the reference direction at the reference point is tangent to the intersecting curve, and wherein the spatial transformation maps each reference point onto a candidate point of a candidate curve of the candidate set and the reference direction associated with the reference point tangent to the candidate curve at the candidate point.

10. Computer-implemented method according to claim 1, wherein the spatial transformation comprises a translation and a rotation.

11. Computer-implemented method according to claim 10, wherein the spatial transformation comprises one or more of a scaling, an inversion, a reflection, and a skewing.

12. Computer-implemented method according to claim 1, wherein the boundary comprises at least two intersections with the intersecting entities, and for each intersection a reference point and a reference direction at the reference point.

13. Computer-implemented method according to claim 12, wherein the boundary comprises at least three intersections with the intersecting entities, and for each intersection a reference point and a reference direction at the reference point.

14. Computer-implemented method according to claim 12, wherein the reference and target computer-aided design models are two-dimensional, wherein an intersecting entity is a curve, wherein a candidate entity is a curve, wherein the reference direction at the reference point is tangent to the intersecting curve, and wherein the spatial transformation maps each reference point onto a candidate point of a candidate curve of the candidate set and the reference direction associated with the reference point tangent to the candidate curve at the candidate point, wherein a first reference direction is associated with a first reference point, wherein a second reference direction is associated with a second reference point, wherein the method comprises the steps of:
   determining an offset distance between the first and second reference points and an offset angle of a vector from the first reference point to the second reference point with respect to the first reference direction;
   obtaining a first candidate curve of the target computer-aided design model;
   determining an offset curve of offset points, wherein each offset point is associated with a candidate point of the first candidate curve, wherein the offset point and the candidate point comprise said offset distance, wherein a vector from the candidate point to the offset point comprises said offset angle with respect to a tangent direction to the first candidate curve at the candidate point;

determining a second curve of the target computer-aided design model which intersects with the offset curve;

computing a trial spatial transformation which maps the first reference point onto the first candidate curve, the first reference direction tangent to the first candidate curve, and the second reference point onto the second candidate curve; and verifying whether the trial spatial transformation maps the second reference direction tangent to the second curve.

15. Computer-implemented method according to preceding claim 14, wherein for the first candidate curve four at least partially non-overlapping offset curves are determined.

16. Computer-implemented method according to claim 1, wherein a list of multiple candidate sets of candidate entities which are spatially compatible with the intersecting entities is automatically retrieved, wherein a candidate set is selected from the list based on proximity to said region or proximity to a cursor of the graphical user interface, wherein the spatial transformation is computed for the selected candidate set.

17. Computer system for feature replication in a computer-aided design model, the computer system configured for:

obtaining a region of a reference computer-aided design model, via user drawing of a boundary for the region in a graphical user interface, wherein the boundary:
   entirely encloses one or more entities of the reference computer-aided design model; and
   intersects one or more entities of the reference computer-aided design model;

automatically determining for each intersecting entity a reference point on the intersecting entity and a reference direction at the reference point, and wherein the region encompasses the reference points;

automatically searching, based on the reference points and reference directions, in a target computer-aided design model, for a candidate set of candidate entities which are spatially compatible with the intersecting entities, wherein a reference point on an intersecting entity defines an inner and an outer part of the intersecting entity, wherein the outer part is positioned at least partially outside said region;

automatically computing a spatial transformation which maps each reference point and reference direction onto a candidate entity of the candidate set, wherein the spatial transformation maps the reference point onto a candidate point of a candidate entity of the candidate set, wherein the candidate point on the candidate entity defines an inner and an outer part of the candidate entity;

replicating, or suggesting via a visualization means the replication of, the one or more entirely enclosed entities according to the determined spatial transformation, wherein said step of replicating, or suggesting via a visualization means the replication of, the one or more entirely enclosed entities according to the determined spatial transformation comprises replacing, or suggesting via a visualization means the replacement of, the inner parts of the candidate entities with the inner parts of the intersecting entities according to the determined spatial transformation.

18. Computer program product for feature replication in a computer-aided design model, the computer program product comprising instructions which, when the computer program product is executed by a computer, cause the computer to carry out the steps of:

obtaining a region of a reference computer-aided design model, via user drawing of a boundary for the region in a graphical user interface, wherein the boundary:
   entirely encloses one or more entities of the reference computer-aided design model; and
   intersects one or more entities of the reference computer-aided design model;

automatically determining for each intersecting entity a reference point on the intersecting entity and a reference direction at the reference point, and wherein the region encompasses the reference points;

automatically searching, based on the reference points and reference directions, in a target computer-aided design model, for a candidate set of candidate entities which are spatially compatible with the intersecting entities, wherein a reference point on an intersecting entity defines an inner and an outer part of the intersecting entity, wherein the outer part is positioned at least partially outside said region;

automatically computing a spatial transformation which maps each reference point and reference direction onto a candidate entity of the candidate set, wherein the spatial transformation maps the reference point onto a candidate point of a candidate entity of the candidate set, wherein the candidate point on the candidate entity defines an inner and an outer part of the candidate entity;

replicating, or suggesting via a visualization means the replication of, the one or more entirely enclosed entities according to the determined spatial transformation, wherein said step of replicating, or suggesting via a visualization means the replication of, the one or more entirely enclosed entities according to the determined spatial transformation comprises replacing, or suggesting via a visualization means the replacement of, the inner parts of the candidate entities with the inner parts of the intersecting entities according to the determined spatial transformation.

* * * * *